(12) United States Patent
Hopson et al.

(10) Patent No.: US 6,703,258 B2
(45) Date of Patent: Mar. 9, 2004

(54) ENHANCED PROBE FOR GATHERING DATA FROM SEMICONDUCTOR DEVICES

(75) Inventors: Theresa J. Hopson, Mesa, AZ (US); Kumar Shiralalgi, Crystal Lake, IL (US); Ronald N. Legge, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/187,526

(22) Filed: Jul. 2, 2002

(65) Prior Publication Data

US 2002/0167008 A1 Nov. 14, 2002

Related U.S. Application Data

(62) Division of application No. 09/703,107, filed on Oct. 31, 2000.

(51) Int. Cl.[7] .................................................. H01L 21/00
(52) U.S. Cl. ...................................................... 438/52
(58) Field of Search ............................. 438/52, 56, 57, 438/59, 48; 257/69, 415, 423, 462, 492

(56) References Cited

U.S. PATENT DOCUMENTS

| | | | | | |
|---|---|---|---|---|---|
| 5,923,033 | A | * | 7/1999 | Takayama et al. | 250/234 |
| 6,337,479 | B1 | * | 1/2002 | Kley | 250/234 |
| 6,477,132 | B1 | * | 11/2002 | Azuma et al. | 369/126 |
| 6,521,921 | B2 | * | 2/2003 | Lim et al. | 257/255 |
| 2003/0012930 | A1 | * | 1/2003 | Brousseau, III | 428/173 |

* cited by examiner

Primary Examiner—Carl Whitehead, Jr.
Assistant Examiner—Jennifer M Dolan
(74) Attorney, Agent, or Firm—William E. Koch

(57) ABSTRACT

An enhanced conductive probe that facilitates the gathering of data and a method of fabricating the probe. The probe includes an amplifier fabricated to define the probe tip. More particularly, the probe structure is defined by an amplifier formed as one of a metal oxide semiconductor (MOS) transistor, a bipolar amplifier, or a metal semiconductor field effect transistor (MESFET), thereby providing for the amplification of the input signal and improved signal to noise ratio during operation of the probe tip.

9 Claims, 3 Drawing Sheets

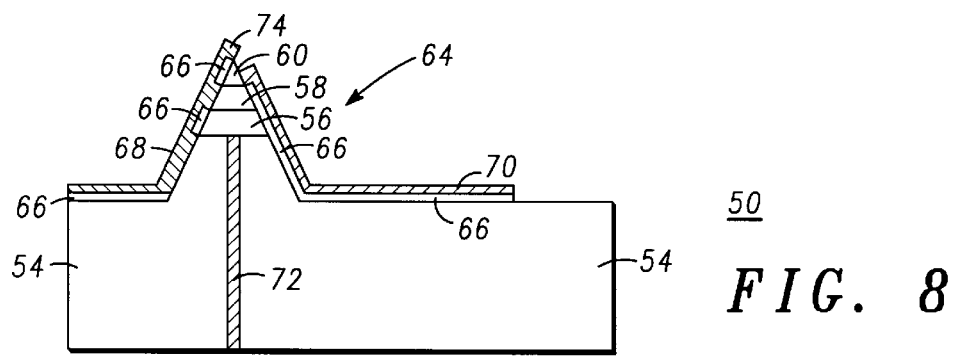
FIG. 8
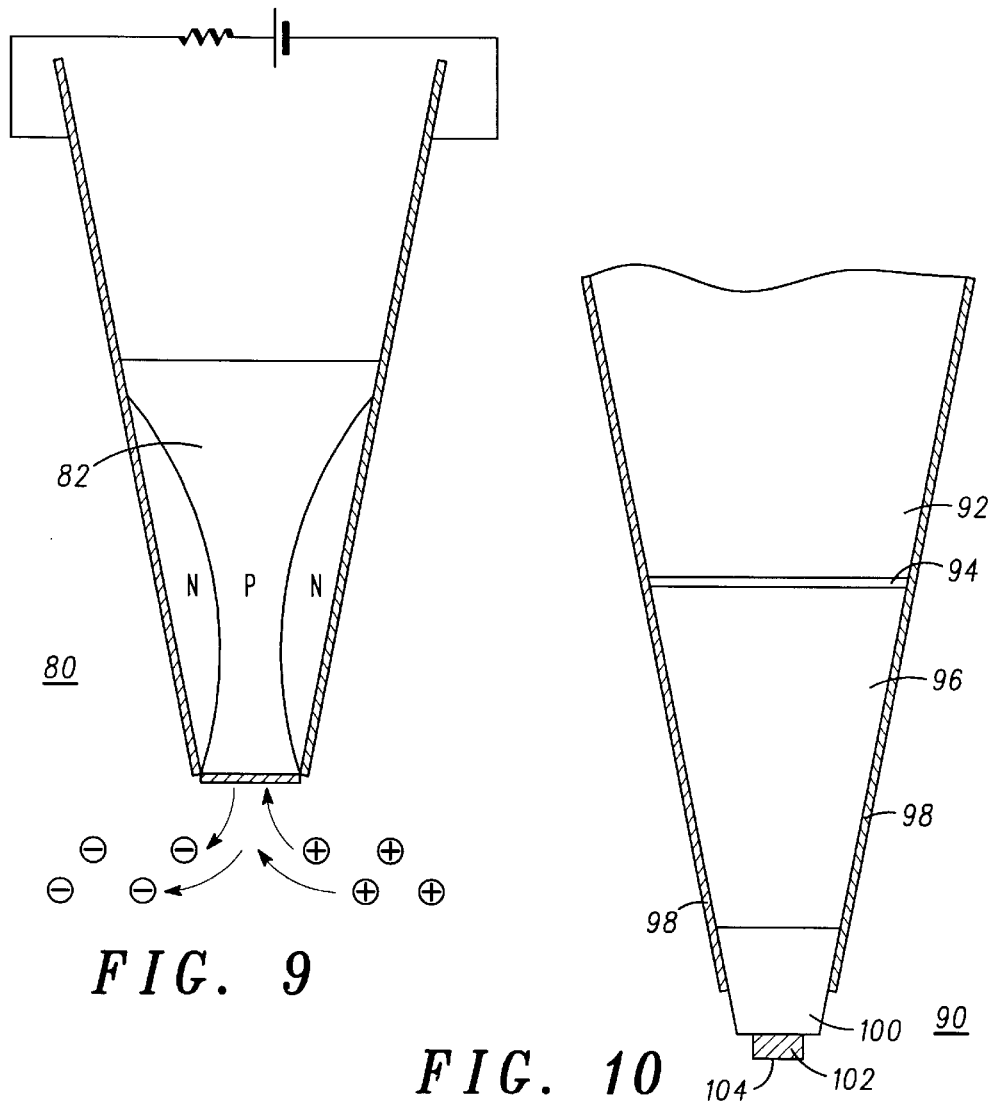
FIG. 9
FIG. 10

ENHANCED PROBE FOR GATHERING DATA FROM SEMICONDUCTOR DEVICES

This application is a Divisional Ser. No. 09/703,107 filed on Oct. 31, 2000.

FIELD OF INVENTION

The present invention relates, in general, to probes that are used for gathering data with respect to semiconductor devices, and materials, and more particularly, to a novel probe for gathering data, including atomic force microscopy images of a semiconductor surface.

BACKGROUND OF THE INVENTION

In the past, the semiconductor industry has used scanning probe microscopy (SPM), such as atomic force microscopy (AFM), scanning capacitance microscopy (SCM), electrostatic/field force microscopy (EFM), scanning tunneling microscopy (STM), scanning thermal microscopy (SThM), to gather surface images and other types of data with respect to semiconductor devices. Specific types of data that can be gathered simultaneous with the gathering of surface images, more specifically topographical data, are thermal data, capacitance data, magnetic field data, electrical field data, and the like. One problem with prior AFM measurement apparatus and measuring techniques is the inability for the devices to provide simultaneous thermal images of a surface, capacitance data, electrical field data, and topographic data while maintaining optimal signal to noise ratio.

Typically, during the process of gathering surface image data, a scanning process is undertaken in which a probe tip is dragged across the surface of the semiconductor device in a rastering manner and the topography of the surface is measured by an optical signal which is reflected off of a mirror affixed to the probe. As another example, during the process of gathering thermal data, a scanning process is undertaken in which a probe tip includes a thermocouple. The thermocouple provides for thermal data to be collected by measuring the temperature of the surface as the probe is moved. During such processes in which data is gathered, amplification of the input signal is a requirement, and thus the inclusion of an amplifier within close proximity to the probe tip is required. More particularly, amplification of such things as the input current, voltage, electric field shifts, and the like, is required.

It is well known in the art to use such amplifiers to amplify the input signal. Generally, an amplifier is provided in conjunction with the probe, being formed as a separate integrated circuit, and spaced a distance, typically millimeters, away from the probe tip. This spacing of the amplifier remote from the probe tip provides for a decrease in signal to noise ratio, but does not overcome the detrimental noise level. In addition, typical probes as they are known today, require for a slow rastering of the probe across the surface. This provides for a very slow procedure for gathering data.

Thus, it is a purpose of the present invention to provide for an enhanced probe for gathering surface image data and additional informational data. More particularly, it is a purpose of the present invention to provide for an improved device and method of forming a conductive nano-probe that includes an amplifier incorporated into the probe tip or the amplifier as defining the probe tip.

It is a purpose of the present invention to provide for a conductive nano-probe that can simultaneously provide for the gathering of information data and a topographical image of a semiconductor surface.

It is yet still a further purpose of the present invention to provide for a probe that incorporates an amplifier for the purpose of amplifying an input signal so as to improve signal to noise ratio, and provide for enhanced gathering of data by the probe.

It is yet another purpose of the present invention to provide for an enhanced probe incorporating an amplifier to provide for the gathering of information in a timely manner.

It is still a further purpose of the present invention to provide for a method of fabricating a probe that provides for the fabrication of an amplifier within the probe or defining the probe.

SUMMARY OF THE INVENTION

The above problems and others are at least partially solved and the above purposes and others are realized in a probe tip that facilitates the gathering of data and a method of fabricating the probe tip. The probe includes an amplifier fabricated to define the probe tip. More particularly, the probe tip includes an amplifier formed as at least one of a metal oxide semiconductor (MOS) transistor, a bipolar amplifier, or a metal semiconductor field effect transistor (MESFET), thereby providing for the amplification of the input signal and increased signal to noise ratio during operation of the probe tip.

BRIEF DESCRIPTION OF THE DRAWINGS

Referring to the drawings:

FIGS. 6–8 are greatly enlarged, simplified sectional views illustrating steps in the method of forming a second embodiment of an enhanced probe in accordance with the present invention.

FIG. 9 is a greatly enlarged, simplified sectional view illustrating in further detail, an enhanced probe tip in accordance with the present invention; and FIG. 10 is a greatly enlarged, simplified sectional view illustrating an enhanced probe tip in accordance with the present invention.

DESCRIPTION OF THE PREFERRED EMBODIMENT

Figure 2:
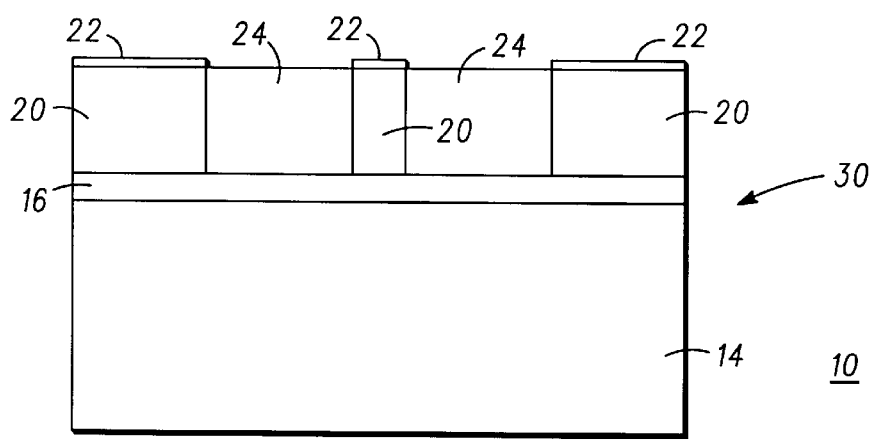
Figure 3:
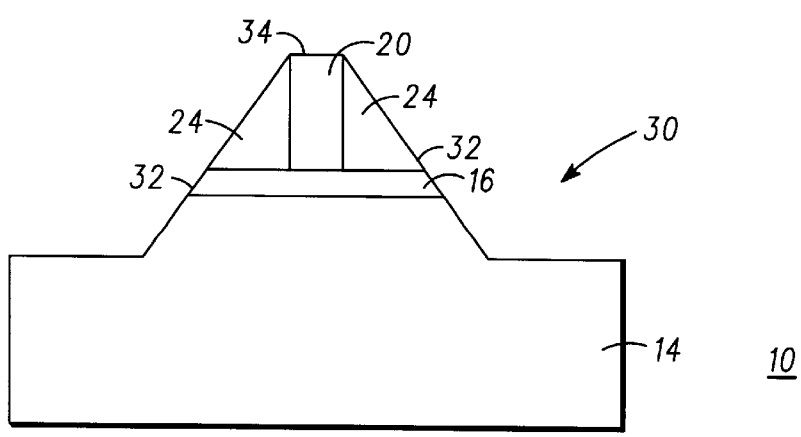
Figure 4:
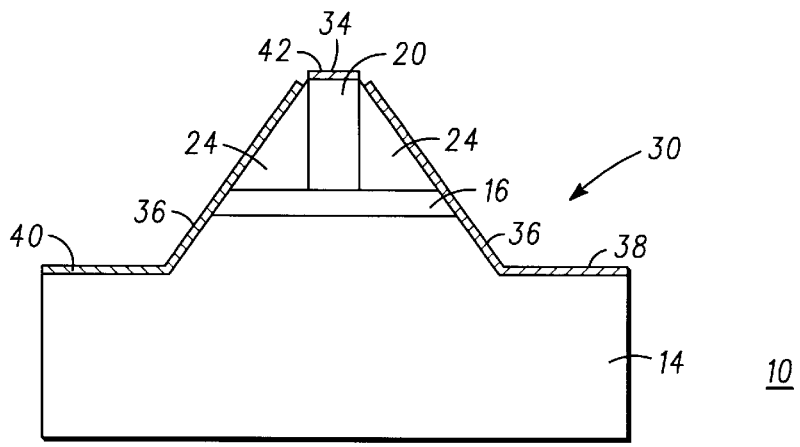

Turning now to the drawings, FIGS. 1–4 illustrate steps in a preferred method of forming an enhanced probe tip 10 according to the present invention. Probe tip 10 is capable of providing signals that facilitate simultaneous formation of thermal images, topographical images, and additional information such as capacitance, electrical field, magnetic field, and the like, of a semiconductor device or material (not shown). Probe 10 includes an amplifier 12 formed therein, and more particularly a metal oxide semiconductor (MOS) transistor, formed therein (as illustrated in FIG. 4), that provides for the receipt and amplification of a produced electrical signal representing information gathered from the semiconductor device.

Figure 1:
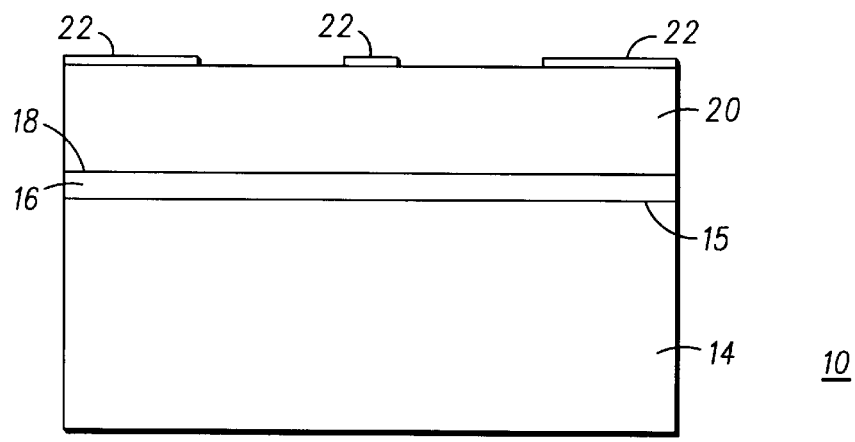
FIGS. 1–4 are greatly enlarged, simplified sectional views illustrating steps in the method of forming a first embodiment of an enhanced probe in accordance with the present invention.

Referring more particularly to FIG. 1, illustrated is a first step in the method of forming enhanced probe tip 10 of the present invention. As illustrated, there is provided a substrate 14, typically formed of a P+ material, such as silicon, gallium arsenide, or any other similar type of material, suitable for forming a P+ substrate. Substrate 14 has grown on an uppermost surface 15 an optional layer 16. Layer 16 is formed of one of an oxide or a nitride material, such as silicon dioxide ($SiO_2$), silicon nitride ($Si_3N_4$), or the like. It should be understood that although layer 16 is illustrated in this particular embodiment, it is optional in the fabrication of an enhanced probe tip according to the present invention.

Next, an epitaxial layer (epi layer) 20 of a P type material is grown on a surface 18 of layer 16. Epilayer 20 is formed of a material similar to substrate 14, at a thickness of approximately 10–15 microns, having a P doping level of approximately 10 Ohm/cm. An oxide mask layer 22 is subsequently grown on an uppermost surface 24 of epilayer 20 according to standard silicon processing techniques. Oxide mask layer 22 will serve as a mask layer for the implant step (discussed presently) necessary to define probe tip 10.

Referring now to FIG. 2, illustrated is the next step in the fabrication of enhanced probe tip 10, according to this specific embodiment of the present invention. As illustrated, with oxide mask layer 22 in place, an N doped material is implanted so as to form N wells 24. It will be understood that oxide mask layer 22 prevents the implanting of N doped material in specific areas and thus serves to aid in defining N doped wells 24. Substrate 14, optional layer 16, P doped layer 20 and N doped wells 24 define stack 30.

Referring now to FIG. 3, as illustrated, stack 30 is etched to define probe tip 10. More particularly, stack 30, including N doped wells 24, P doped material 20, optional layer 16, and substrate 14 are etched to define probe tip 10, including sidewalls 32, and tip point 34.

Figure 5:
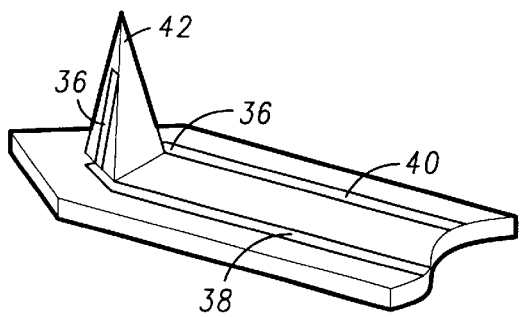
FIG. 5 is a simplified orthogonal view illustrating an enhanced probe tip in accordance with the present invention.

Referring now to FIG. 4, illustrated is enhanced probe tip 10 including metal contacts 36. To form metal contacts 36, a photoresist (not shown) is positioned prior to the deposition of a conductive metal, such as aluminum, gold, or any other similar conductive metal. Metal contacts 36 are formed adjacent sidewalls 32 and (as illustrated in FIG. 5) lead to a first coupling wire 38 and a second coupling wire 40. Wires 38 and 40 can be any variety of coupling metal or alloy that are well known to those skilled in the art.

In this preferred embodiment, probe tip 10 includes a diamond shard 42 that is positioned proximate the defined MOS transistor, and more particularly adjacent tip point 34. It should be understood that while diamond shard 42 is described with reference to this preferred embodiment, diamond shard 42 is optional and it is anticipated that a probe tip could be fabricated without the inclusion of diamond shard 42. Diamond shard 42 is used because it is electrically isolating, thermally conducting and provides for a more robust tip point 34. There should be no contamination or adhesive between diamond shard 42 and MOS transistor.

As illustrated in FIG. 5, probe tip 10, including amplifier 12, provides for the amplification of input signals and thus increased signal to noise ratio.

Figure 6:
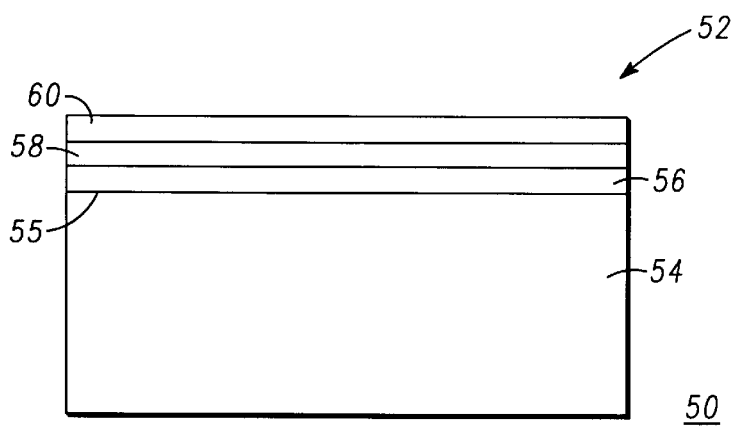
Figure 7:
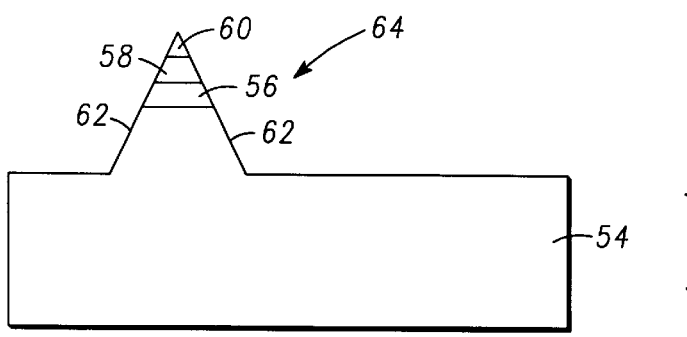

Referring now to FIGS. 6–8, illustrated is a second embodiment of an enhanced probe tip according to the present invention. In this particular embodiment, illustrated is an enhanced probe tip, generally referenced 50, and the steps in the method of fabricating probe tip 50. Referring specifically to FIG. 6, illustrated is a stack 52, comprised of a substrate material 54, and epi layers 56, 58 and 60. Substrate material 54 is typically an N+ material, but it should be understood that a P+ material is anticipated by this disclosure. Substrate 54 is formed of silicon, gallium arsenide, or similar type material. Next, a plurality of epi layers 56, 58 and 60 are formed on an uppermost surface 55 of substrate 54. Epi layers 56, 58 and 60 are generally formed of a suitable material in which epilayer 56 is N+ doped, layer 58 is P+ doped and layer 60 is N+ doped. Epi layers 56, 58 and 60 are generally formed by techniques such as chemical vapor deposition.

Referring now to FIG. 7, illustrated is probe tip 50 that has been formed by etching stack 52, to define sidewalls 62. Layers 56, 58 and 60 in combination will serve as a bipolar amplifier, generally referenced 64. As illustrated, bipolar amplifier 64 is formed to define the actual probe tip 50.

Referring now to FIG. 8, illustrated in simplified sectional view is enhanced probe 50 including bipolar amplifier 64. Next, during the fabrication of enhanced probe 50, a plurality of oxide insulating layers 66 are deposited on sidewalls 62 and substrate 54. Oxide insulating layers 66 provide for isolation of epi layers 56, 58 and 60, and thereby preventing the electrical shorting of bipolar amplifier 64. A contact metal 68 is next formed for the base and a contact metal 70 is formed for the emitter portion of bipolar amplifier 64. It should be understood that contact metal 68 extends beyond amplifier 64 and is then defined as described below.

Next, an etch is performed to etch away a portion of substrate 54, thereby providing for formation of a contact metal 72 for the collector portion of bipolar amplifier 64. Contact metals 68, 70 and 72 are typically formed of any conductive metal, such as aluminum, gold, or the like. Contact metal 68, 70 and 72 provide for electrical interface of probe tip 50 with the input source (not shown). As a final step in the fabrication of enhanced probe tip 50, including bipolar amplifier 64, bipolar amplifier 64 is further defined by using focused ion beam techniques for final shaping of metal contact 68, thereby forming a tip point 74 to aid in the collection of data.

Referring now to FIG. 9, illustrated in simplified sectional view is an enlarged sectional view of an enhanced probe tip 80, formed according to the present invention. Probe tip 80 is formed generally similar to probe tip 10 of FIGS. 1–5, and includes a MOS amplifier 82, formed within tip 80. In this particular embodiment, and in contrast to the embodiment illustrated in FIGS. 1–5, probe tip 80 during operation is reverse biased, source to drain, thereby providing for the manipulation of electrically charged organic matter. In addition, by reverse biasing probe tip 80, a means for changing or modifying the electrical fields of a charged surface at submicron resolution is provided.

Referring now to FIG. 10, illustrated is a third embodiment of an enhanced probe tip according to the present invention. In this particular embodiment, illustrated is an enhanced probe tip, generally referenced 90. Illustrated is probe tip 90, where probe tip 90 is formed as a metal semiconductor field effect transistor (MESFET). Probe tip 90 is generally comprised of a substrate material 92, onto which an optional nitride insulating layer 94 is formed. Substrate 90 is formed of silicon, gallium arsenide, or similar type material. Next, a second substrate layer 96 is formed having a channel layer 100 formed thereon an uppermost surface. There is formed about an exterior aspect of probe tip 90, a source contact 98 and a drain contact 99. A gate metal 102 forms the tip 104 of probe tip 90. Tip 104, is formed of gate metal 102, thereby providing for the measuring of potential, or the measuring of voltages as a function of tip 104 position.

In yet another alternate embodiment, any of the previous disclosed-probe tips, including probe tips 10, 50 and 90, as described with reference to FIGS. 1–10, can be treated, such as through dipping, coating, or the like, with a protein. Proteins which may be utilized include biotin or steptavidin, or any other similar protein material. This treating of the probe tip provides for the enhancement in the collection, manipulation, and imaging of organic matter.

Thus, an efficient method of manufacturing an enhanced probe tip device and the actual enhanced probe tip device have been disclosed. The enhanced probed tip device as disclosed, includes an amplifier formed within or formed as the actual probe tip. The amplifier is formed as a MOS transistor, a bipolar amplifier, or a metal semiconductor field effect transistor. As disclosed, dependent upon operation sought, the probe tip when including a MOS amplifier, can be forward biased to act as a standard transistor or reverse biased to serve to manipulate organic matter. Further, while specific examples and method of fabrication steps are utilized herein for purposes of explanation, those skilled in the art will understand that many varieties of materials, forms, and methods of fabrication may be utilized.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating an enhanced probe tip including the steps of:

providing a substrate layer;

forming an amplifier on an uppermost surface of the substrate layer including the stey of forming one of a metal oxide semiconductor (MOS) transistor, a bipolar amplifier, or a metal semiconductor field effect transistor according to standard silicon processing techniques; and wet etching an outermost aspect of the amplifier to define a probe tip.

2. A method of fabricating an enhanced probe tip as claimed in claim 1 wherein a metal oxide semiconductor transistor is formed, including the step of depositing a P-doped epitaxial layer on an uppermost surface of the substrate.

3. A method of fabricating an enhanced probe tip as claimed in claim 2 wherein the step of forming an amplifier includes the step of applying an oxide mask layer to a surface of the P-doped epitaxial layer.

4. A method of fabricating an enhanced probe tip as claimed in claim 3 wherein the step of forming an amplifier includes the step of implanting a plurality of N-doped wells in the P-type epitaxial layer.

5. A method of fabricating an enhanced probe tip as claimed in claim 4 wherein the step of forming an amplifier includes the step of forming a contact metal on an exterior aspect of the probe tip.

6. A method of fabricating an enhanced probe tip as claimed in claim 1 wherein the step of forming an amplifier on an uppermost surface of the substrate layer includes the step of forming a bipolar amplifier.

7. A method of fabricating an enhanced probe tip as claimed in claim 6 wherein the step of forming a bipolar amplifier further includes the step of depositing alternating layers of a N-doped epitaxial layer and a P-doped epitaxial layer.

8. A method of fabricating an enhanced probe tip as claimed in claim 7 wherein the step of forming an amplifier includes the step of forming a contact metal on an exterior aspect of the probe tip.

9. A method of fabricating an enhanced probe tip as claimed in claim 1 wherein the step of forming an amplifier on an uppermost surface of the substrate layer includes the step of forming a metal semiconductor field effect transistor.

* * * * *